(12) United States Patent
Mole et al.

(10) Patent No.: US 8,339,198 B2
(45) Date of Patent: Dec. 25, 2012

(54) NEGATIVE CAPACITANCE SYNTHESIS FOR USE WITH DIFFERENTIAL CIRCUITS

(75) Inventors: Peter J. Mole, St. Albans (GB); Philip V. Golden, Menlo Park, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 13/534,622

(22) Filed: Jun. 27, 2012

(65) Prior Publication Data

US 2012/0268206 A1    Oct. 25, 2012

Related U.S. Application Data

(62) Division of application No. 12/604,955, filed on Oct. 23, 2009, now Pat. No. 8,228,120.

(60) Provisional application No. 61/182,471, filed on May 29, 2009, provisional application No. 61/221,486, filed on Jun. 29, 2009.

(51) Int. Cl.
   *H03F 3/45* (2006.01)
(52) U.S. Cl. .............. 330/252; 330/302; 330/308
(58) Field of Classification Search .................. 330/252, 330/308, 302
   See application file for complete search history.

(56) References Cited

U.S. PATENT DOCUMENTS

| | | | |
|---|---|---|---|
| 4,215,312 A | 7/1980 | Takayama | |
| 4,296,392 A | 10/1981 | Lee | |
| 4,885,548 A | 12/1989 | Wakimoto et al. | |
| 5,475,343 A | 12/1995 | Bee | |
| 5,640,112 A | 6/1997 | Goto et al. | |
| 5,767,542 A * | 6/1998 | Nakamura | 257/296 |
| 5,920,235 A | 7/1999 | Beards et al. | |
| 6,078,218 A | 6/2000 | Hirabayashi et al. | |
| 6,731,163 B2 | 5/2004 | Huckins et al. | |
| 6,785,477 B1 | 8/2004 | Masuda et al. | |
| 6,943,633 B2 | 9/2005 | Singh | |
| 6,950,694 B2 | 9/2005 | Yonce | |
| 7,453,322 B2 | 11/2008 | Li et al. | |
| 7,496,155 B1 | 2/2009 | Lu et al. | |

(Continued)

OTHER PUBLICATIONS

Nauta, B., "A CMOS Transconductance—C Filter Technique for Very High Frequencies," IEEE J. of Solid-State Circuits, vol. 27, No. 2 (Feb. 1992), pp. 142-153.

(Continued)

*Primary Examiner* — Patricia Nguyen
(74) *Attorney, Agent, or Firm* — Vierra Magen Marcus & DeNiro LLP (57) ABSTRACT

Provided herein are methods and circuits that reduce a differential capacitance at differential nodes of a differential circuit while boosting the common mode capacitance at the differential nodes, where the differential circuit includes a pair of inputs and differential outputs. A negative capacitance is generated between differential nodes of the differential circuit, which can be accomplished by connecting a negative capacitance circuit between the differential nodes of the differential circuit. In an embodiment, the negative capacitance circuit is connected in parallel with the differential outputs of the differential circuit. In another embodiment, the negative capacitance circuit is connected in parallel with the inputs of the differential circuit. In still another embodiment, the negative capacitance circuit is connected in parallel with the differential internal nodes (i.e., nodes other than the input and output nodes) of the differential circuit.

19 Claims, 10 Drawing Sheets

U.S. PATENT DOCUMENTS

| | | | |
|---|---|---|---|
| 7,609,111 B2 | 10/2009 | Golden et al. | |
| 7,760,013 B2 | 7/2010 | Bankman et al. | |
| 7,852,174 B2 * | 12/2010 | Cathelin et al. | 333/213 |
| 7,863,980 B2 | 1/2011 | Golden et al. | |
| 8,013,379 B2 * | 9/2011 | Futatsugi | 257/312 |
| 2004/0046616 A1 * | 3/2004 | Prentice | 331/111 |
| 2009/0273370 A1 * | 11/2009 | Shinde | 326/115 |
| 2010/0327940 A1 | 12/2010 | Eisenstadt et al. | |
| 2011/0028089 A1 | 2/2011 | Komori | |

OTHER PUBLICATIONS

Toumazou et al., "Analogue IC Design: The Current-Mode Approach," Peter Peregrinus Ltd., IEE Circuits and Systems, Series 2 (1989), pp. 72-73, 90-91.

* cited by examiner

NEGATIVE CAPACITANCE SYNTHESIS FOR USE WITH DIFFERENTIAL CIRCUITS

PRIORITY CLAIMS

This application is a Divisional of U.S. patent application Ser. No. 12/604,955, entitled Negative Capacitance Synthesis for Use with Differential Circuits", filed Oct. 23, 2009, which claims priority under 35 U.S.C. 119(e) to U.S. Provisional Patent Application No. 61/182,471, entitled "Negative Capacitance Synthesis for Use with Differential Circuits", filed May 29, 2009 and U.S. Provisional Patent Application No. 61/221,486, entitled "Negative Capacitance Synthesis for Use with Differential Circuits", filed Jun. 29, 2009. Priority is claimed to each of the above applications, and each of the above applications is incorporated herein by reference.

RELATED PATENTS

This application is related to commonly assigned U.S. Pat. No. 7,609,111 entitled "Negative Capacitance Synthesis" and commonly assigned U.S. Pat. No. 7,863,980, entitled "Amplifiers with Negative Capacitance Circuits".

FIELD OF THE INVENTION

Embodiments of the present invention relate to circuits and methods that generate a negative capacitance for use with differential circuits.

BACKGROUND OF THE INVENTION

Figure 1:
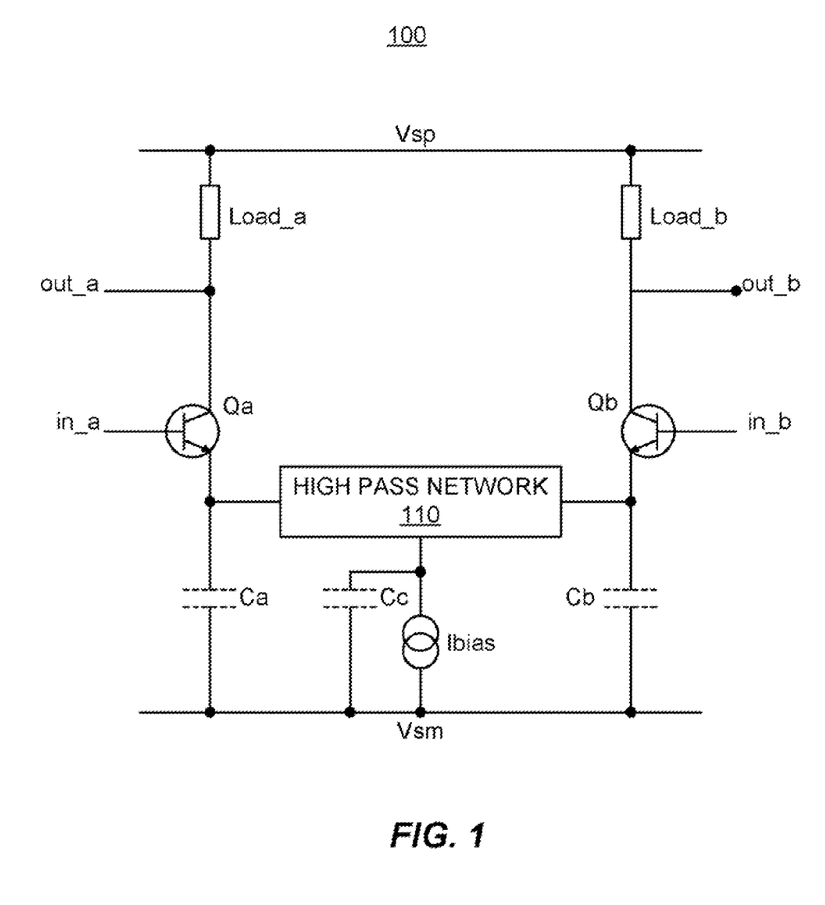
FIG. 1 shows an exemplary equalizer stage with differential inputs and differential outputs, where the stage has a differential mode gain and a common mode gain.

To boost the high frequency gain of a differential signal path, the differential high pass circuit 100 of FIG. 1 can be used. Referring to FIG. 1, two input bipolar junction transistors (BJTs) Qa and Qb, which can alternatively be metal oxide semiconductor (MOS) transistors, have an input signal applied differentially across their inputs. Stated another way, the transistors Qa and Qb (also referred to as input devices) receive a pair of input signals. A high pass network 110 is connected between the reference terminals (i.e., the emitters or sources) of the input devices Qa and Qb, to pass high frequency components and block low frequency components of the input signals. The high pass network also provides a bias current feed. A load_a and a load_b are connected, respectively, between the collectors (or drains) of the input devices Q1 and Qb and a high voltage rail (Vsp). Differential outputs (out_a and out_b) of the circuit 100 are provided at a node between the load_a and the collector (or drain) of the transistor Qa and a node between the load_b and the collector (or drain) of the transistor Qb.

The input devices Qa and Qb and the high pass network 110 provide a high pass transconductor that generates an output voltage across load_a and load_b. Because the high pass network 110 is differentially connected, it contributes to the differential output voltage, without adding to the common mode signal at out_a and out_b.

Parasitic capacitances to a low voltage rail (Vsm, e.g., ground or some other low voltage rail, such as, but not limited to, a negative voltage rail), illustrated by Ca, Cb and Cc (shown in dashed line), cause the common mode gain to increase with increases in frequency. If a single stage 100 were used, this may be acceptable. However, when cascading several such stages, as often required to equalize a cable with high frequency loss, the rising gain at higher frequencies will cause undesirable common mode behavior, including but not limited to common mode oscillation.

One way to attempt to suppress the rising gain at higher frequencies is to place capacitors across (i.e., in parallel with each of) load_a and load_b. However, this would suppress the desired increase in differential gain.

Another solution for suppressing common mode gain at higher frequencies is to build in a common mode loop that detects increases in the common mode voltages at the differential outputs using a sum of two output voltages. A high gain amplifier can be used to compare the sum of these two output voltages to a desired reference voltage. The high gain amplifier can also be used to modulate the bias current source and effectively null out the voltages induced in the parasitic capacitance, and more generally, to provide common mode feedback. However, with this solution, because the bandwidth of the high pass network 110 is very wide, it becomes very difficult to make the feedback loop have a wide enough bandwidth to follow the currents. Additionally, as frequencies increase, the high frequency effects of the injected currents are not cancelled, at which points the capacitive currents are at their most severe, since capacitive impedance drops with increases in frequency.

SUMMARY

Certain embodiments of the present invention are directed to methods for use with a differential circuit having a pair of inputs and differential outputs. In an embodiment, a negative capacitance is generated between differential nodes of the differential circuit to thereby reduce a differential capacitance at the differential nodes while boosting the common mode capacitance at the differential nodes. This can be accomplished by connecting a negative capacitance circuit between the differential nodes of the differential circuit to thereby generate the negative capacitance between the differential nodes. The differential circuit can include numerous differential nodes, including, for example, the differential outputs of the differential circuit, the pair of inputs of the differential circuit, and internal differential nodes of the differential circuit. Accordingly, the negative capacitance circuit can be connected between the differential outputs of the differential circuit so that the negative capacitance circuit is in parallel with the differential outputs. In another embodiment, the negative capacitance circuit can be connected between the pair of inputs of the differential circuit so that the negative capacitance circuit is in parallel with the pair of inputs. In a further embodiment, the negative capacitance circuit can be connected between a pair of internal nodes of the differential circuit so that the negative capacitance circuit is in parallel with the pair of internal nodes. More generally, the differential nodes between which the negative capacitance circuit is connected can be any pair of high impedance differential nodes that can affect a high frequency response of the differential circuit.

Certain embodiments of the present invention are for use with a plurality of cascaded differential stages. Such embodiments include, within each of at least two of the differential stages, generating a negative capacitance between differential nodes of the differential stage to thereby reduce a differential capacitance at the differential nodes while boosting the common mode capacitance at the differential nodes. This can be accomplished by, within each of at least two of the differential stages, connecting a negative capacitance circuit between any pair of high impedance differential nodes that can affect a high frequency response of the differential stage. The negative capacitance circuits mitigate increases in common mode gain of the cascaded differential stages that would otherwise occur due to the differential stages being cascaded, while boosting differential gain of the cascaded differential stages. In one embodiment, each of the cascaded differential stages is a high pass network.

Embodiments of the present invention are also directed to circuits that include a plurality of cascaded differential stages, with at least a first negative capacitance circuit connected between differential nodes of a first one of the plurality of cascaded differential stages, and a second negative capacitance circuit connected between differential nodes of a second one of the plurality of cascaded differential stages. Such negative capacitance circuits mitigate increases in common mode gain of the cascaded differential stages that would otherwise occur due to the differential stages being cascaded, while boosting differential gain of the cascaded differential stages. In a specific embodiment of the present invention the plurality of cascaded differential stages comprise at least three differential stages, and a negative capacitance circuit is connected within each of the plurality of cascaded differential stages.

Embodiments of the present invention are also directed to the specific negative capacitance circuits described below.

This summary is not intended to summarize all of the embodiments of the present invention. Further and alternative embodiments, and the features, aspects, and advantages of the embodiments of invention will become more apparent from the detailed description set forth below, the drawings and the claims.

DETAILED DESCRIPTION

Figure 2:
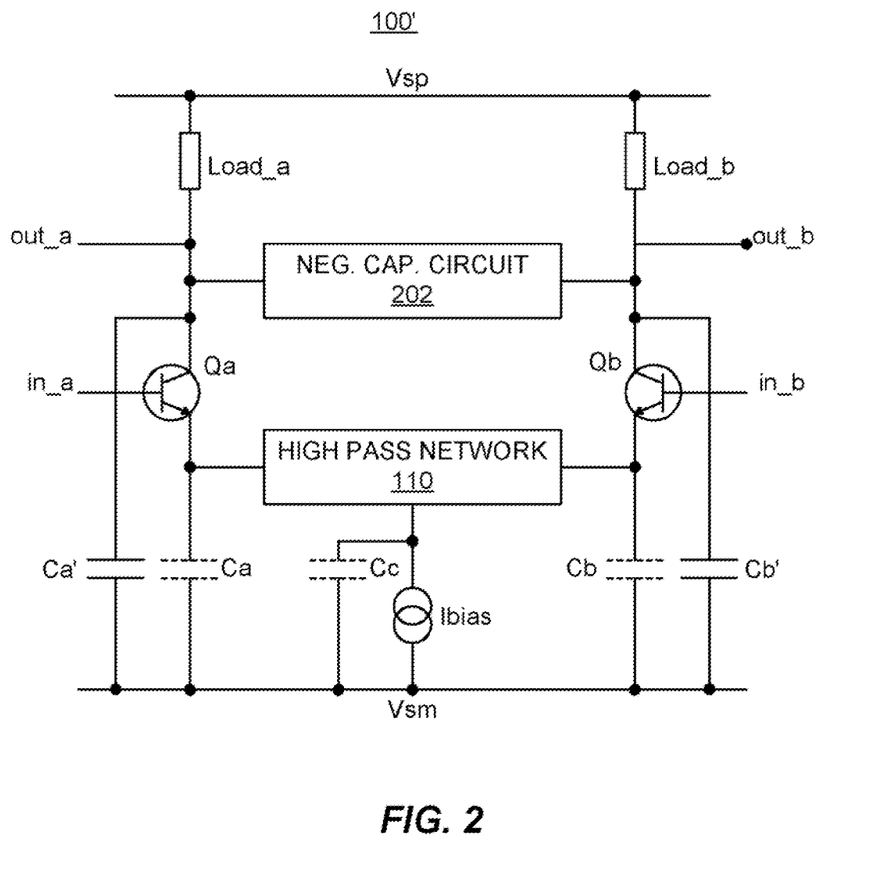
FIG. 2 illustrates how, in accordance with an embodiment of the present invention, compensation capacitors and a negative capacitance circuit can be added to the stage of FIG. 1 in a manner that reduces common mode gain at high frequencies while having negligible effect on the differential gain.

Referring to FIG. 2, in accordance with an embodiment, capacitors Ca' and Cb' are added to the stage 100, respectively, between the output out_a and the low voltage rail Vsm, and between the output out_b and the low voltage rail Vsm, to reduce (and preferably prevent) high frequency common mode currents introduced by the parasitic capacitances Ca, Cb and Cc. In this configuration, so long as the capacitors Ca' and Cb' are large relative to Ca, Cb and Cc, the gain for common mode signals will remain below unity, even at the highest frequencies. In an embodiment, Ca' and Cb' are each at least 10 times larger than the largest of Ca, Cb and Cc. This will ensure that when cascading a plurality of the stages 100 the common mode gain will not grow to the point where instabilities can arise due to a high common mode gain.

Figure 3A:
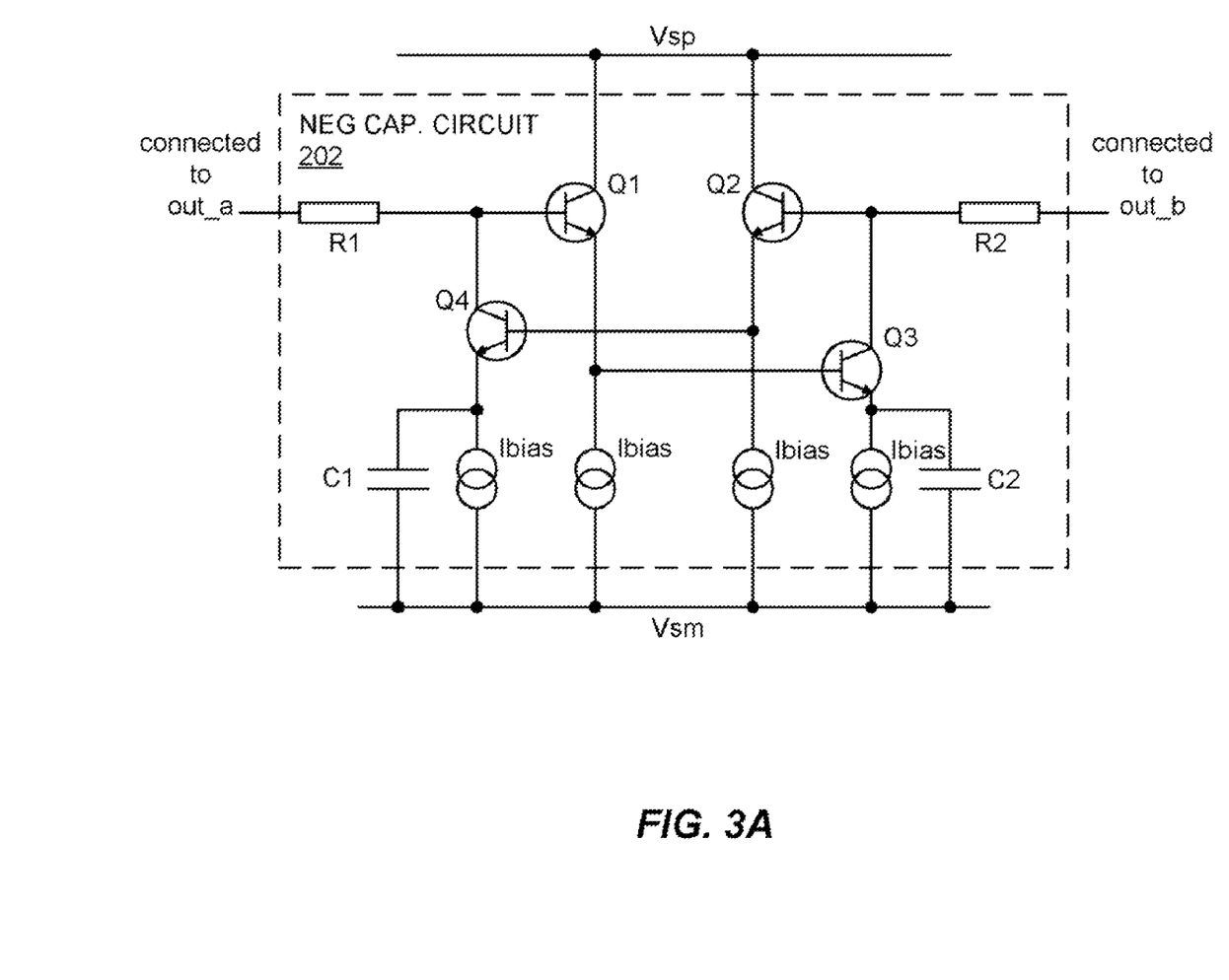
FIG. 3A is a circuit diagram of a negative capacitance circuit, according to an embodiment of the present invention.
Figure 3B:
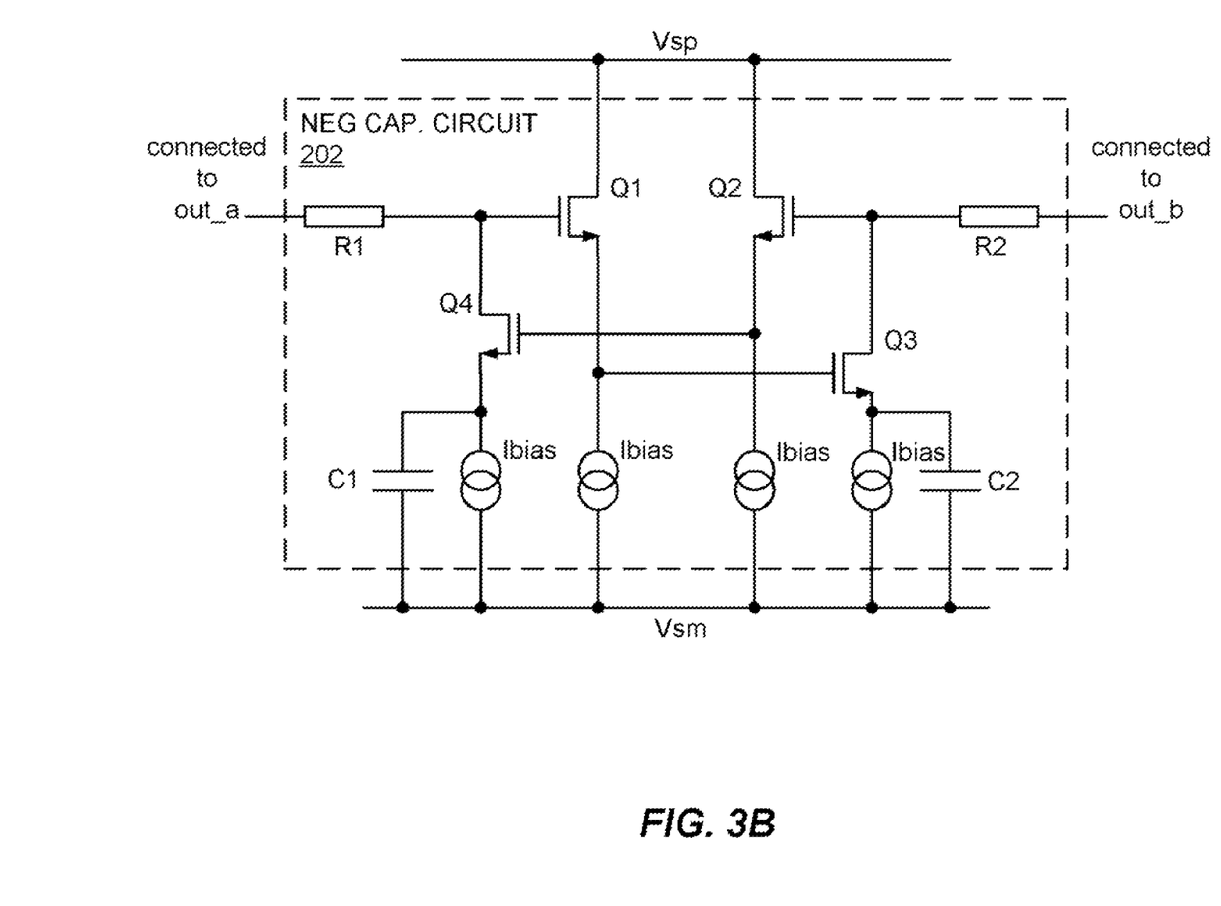
FIG. 3B is a circuit diagram of a negative capacitance circuit, according to an alternative embodiment of the present invention.

While the adding of the load capacitors Ca' and Cb' can be used to control the common mode gain, the adding of the capacitors Ca' and Cb' also causes an undesirable pole to appear in the differential response of the stage 100. More specifically, such a pole can cause a loss of desirable high frequency differential gain. In accordance with an embodiment of the present invention, to compensate for (and preferably prevent) this pole from causing a loss of high frequency differential gain, a negative capacitance circuit 202 is introduced across (i.e., between) the differential outputs out_a and out_b. The purpose of the negative capacitance circuit 202, when added as shown in FIG. 2, is to reduce (and preferably completely or at least substantially negate) the differential effects (i.e., components) due to the capacitors Ca' and Cb', while boosting the common mode effects (i.e., components) due to the capacitors Ca' and Cb'. This is achieved by reducing (and preferably canceling) the differential mode capacitance of capacitors Ca' and Cb', while boosting the common mode capacitance of the output nodes. Details of the negative capacitance circuit 202, according to embodiments of the present invention, are shown in FIGS. 3A and 3B. The stage 100 with the negative capacitance circuit can be referred to as stage 100'.

Referring to FIG. 3A, the negative capacitance circuit 202, according to an embodiment of the present invention, includes transistors Q1, Q2, Q3 and Q4, bias current sources (Ibias) connected between the emitters of transistors Q1, Q2, Q3 and Q4, and a low voltage supply rail (Vsm), and capacitors C1 and C2. The negative capacitance circuit 200 operates as described below.

Figure 3C:
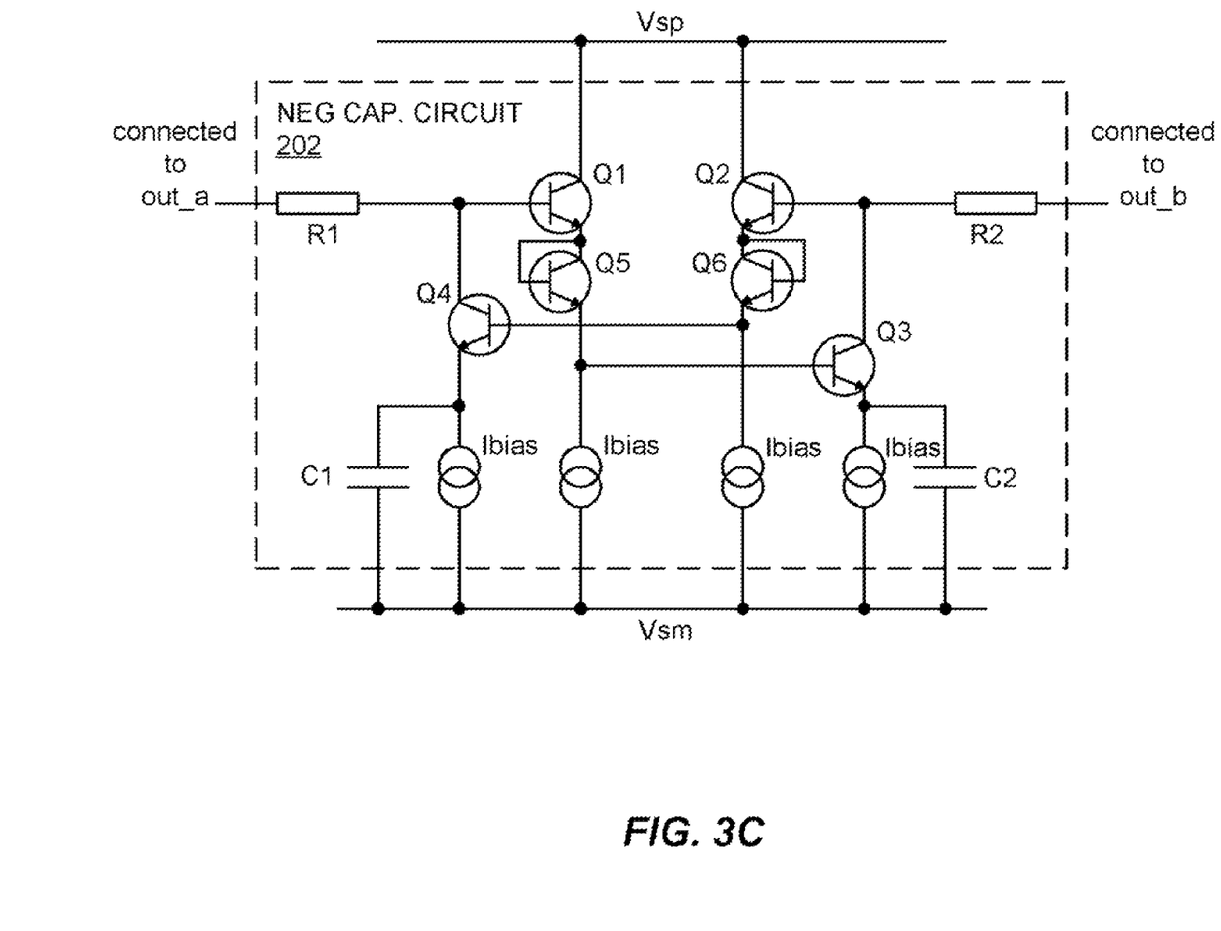
FIG. 3C illustrates a slight modification to the negative capacitance circuit of FIG. 3A.

The transistors Q1 and Q2 offset the input voltages by a base-emitter voltage (VBE) before they are applied to the bases of the transistors Q3 and Q4. This increases the input signal range that can be applied to the circuit without transistors Q3 and Q4 entering into their saturation region (or the triode region where MOS transistors are used). Further, to increase the maximum differential input signal that can be applied to the negative capacitance circuit 202 before one of it's transistors saturates, optional diodes can be added as shown in FIG. 3C. Still referring to FIG. 3A, the transistor Q4 applies an offset replica of the voltage applied to the out_b terminal to the capacitor C1. However, the capacitor current passes through the transistor Q4 and appears at the out_a terminal. Similarly, the transistor Q3 applies an offset replica of the voltage applied to the out_a terminal to the capacitor C2, and the capacitor current passes through the transistor Q3 and appears at the out_b terminal. In this manner, when a voltage difference is applied between the input terminals of the negative capacitance circuit 202 (which are connected to the output terminals out_a and out_b of the stage 100), a current that flows due to the applied differential voltage appears to be reversed relative to the current in the case the same differential input was applied to a capacitor. However, when a common mode voltage is applied between the input terminals of the negative capacitance circuit 202 (which are connected to the output terminals out_a and out_b of the stage 100), the same current appears to flow in both the capacitors C1 and C2, and there is not a sign reversal.

In the above described manner, the negative capacitance circuit 202 cancels the unwanted differential capacitance, while boosting the common mode capacitance and thus improving the common mode attenuation. Stated another way, the differential mode capacitance is canceled, while the common mode capacitance is boosted.

In an alternative embodiment, the negative capacitance circuit 202 can be implemented using MOS transistors, as shown in FIG. 3B.

The impedance synthesized by the negative capacitance circuit 202 also contains a negative real part that could cause oscillations if it is connected at a sensitive node. To reduce (and preferably cancel) this negative real part of the impedance, resistors R1 and R2 can optionally be connected in series with the bases (or gates) of the transistors Q1 and Q2, as shown in FIG. 3A (and FIG. 3B). The resistors R1 and R2 can be implemented, e.g., as discrete resistors, as diode connected transistors, as metal-oxide-semiconductor (MOS) resistors, but are not limited thereto.

Figure 3D:
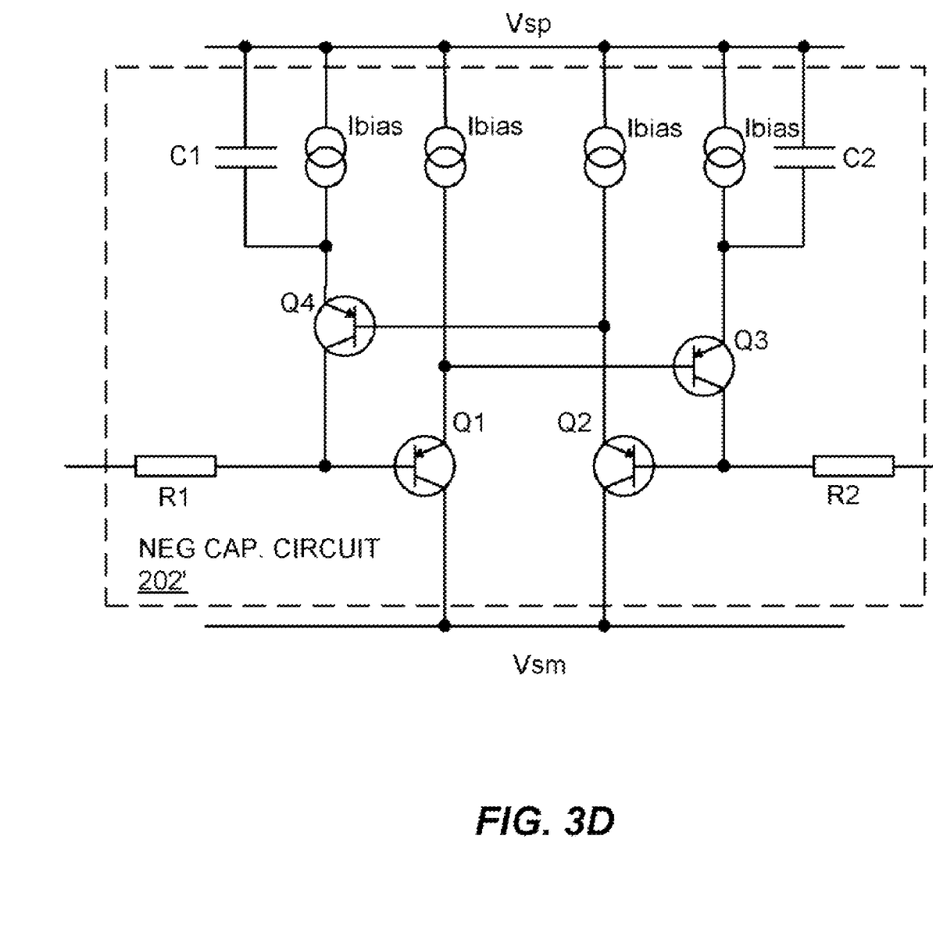
FIGS. 3D and 3E are circuit diagrams of negative capacitance circuits, according to further embodiments of the present invention.
Figure 3E:
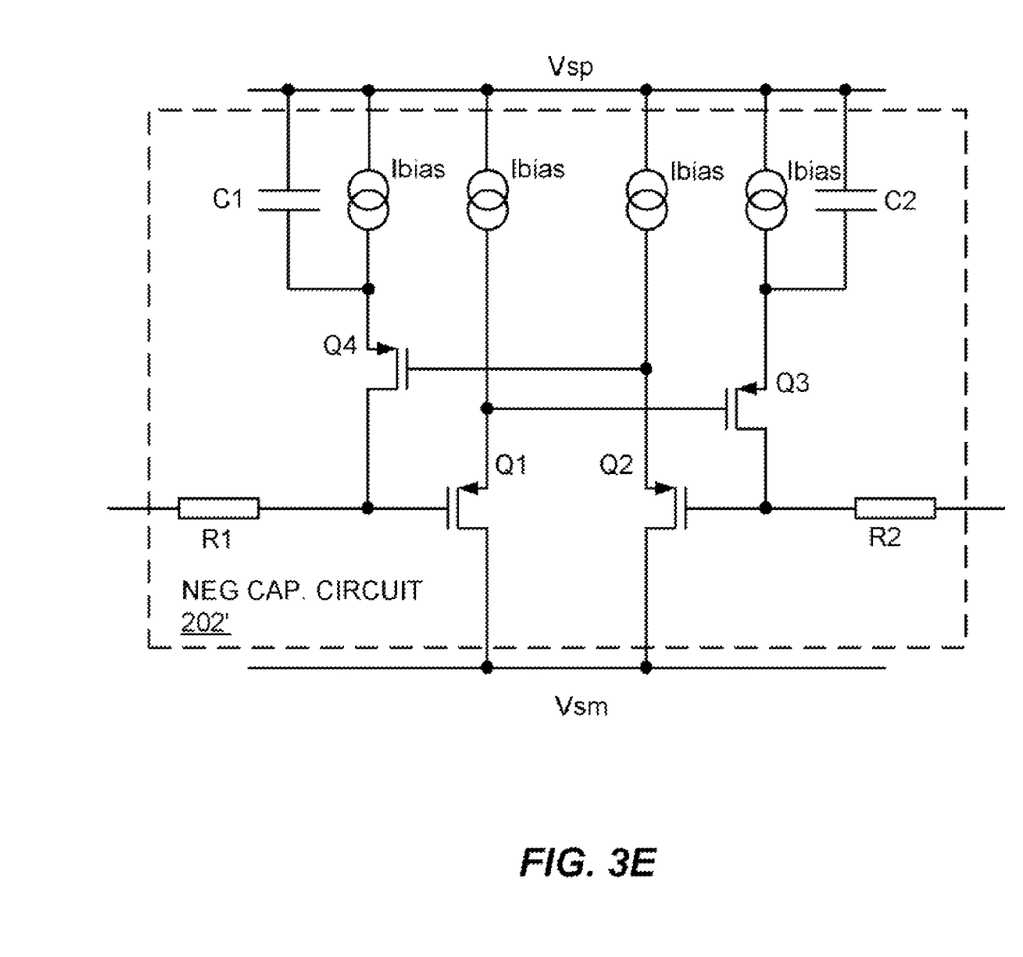

In the above described embodiments, the differential capacitance that is being canceled is connected to the Vsm voltage rail. If the desire were to cancel a differential capacitance connected to the Vsp voltage rail, the negative capacitance circuits 202' of FIGS. 3D and 3E can be used.

Figure 4:
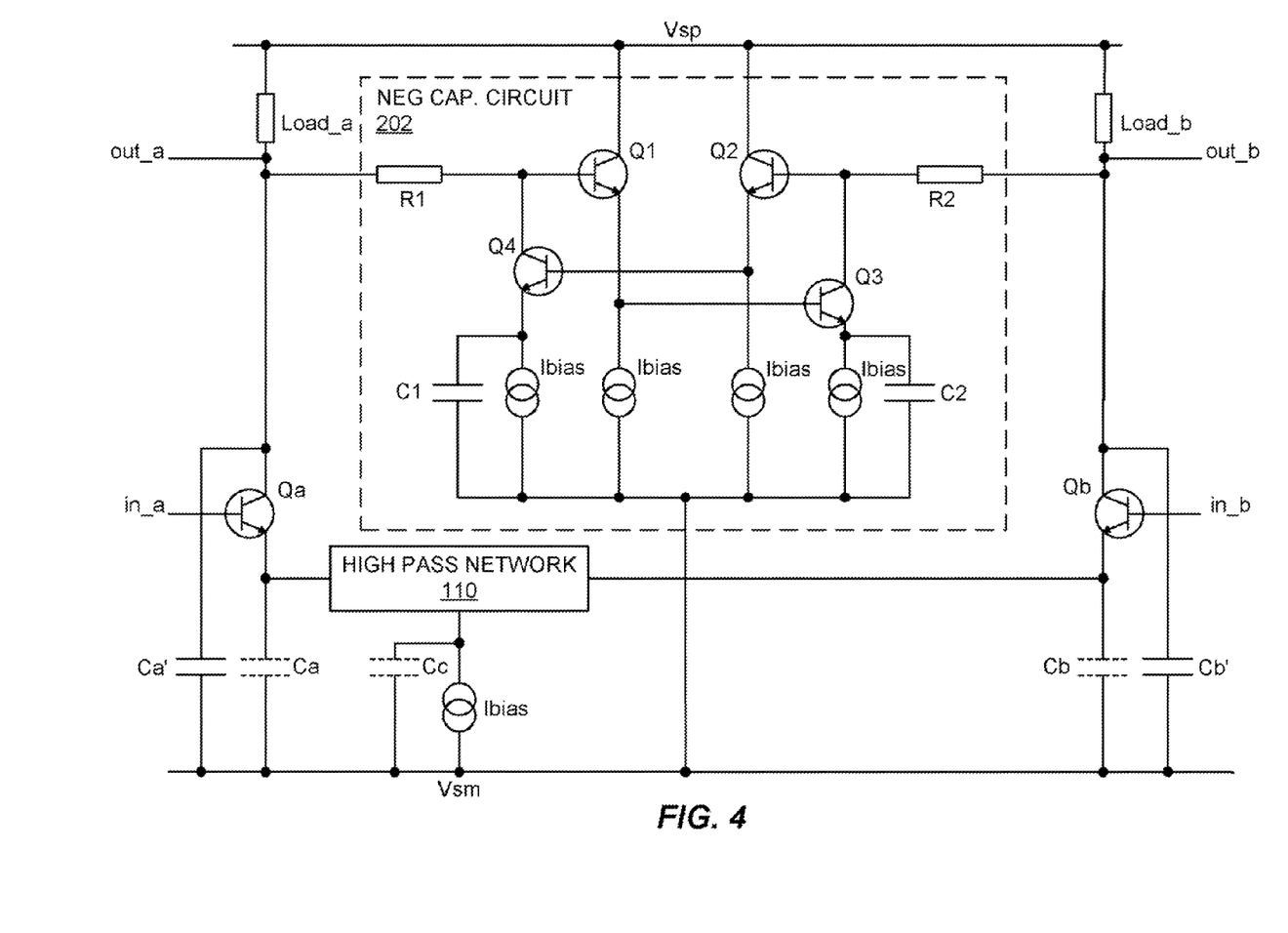
FIG. 4 is a circuit diagram of the differential input/differential output high pass stage of FIG. 1 with the negative capacitance circuit of FIG. 3A added in parallel with the differential outputs.

For completeness, FIG. 4 is a circuit diagram of the differential equalizer stage 100 of FIG. 1 with the negative capacitance circuit 202 of FIG. 3A added in parallel with the high impedance outputs of the stage 100.

Figure 5:
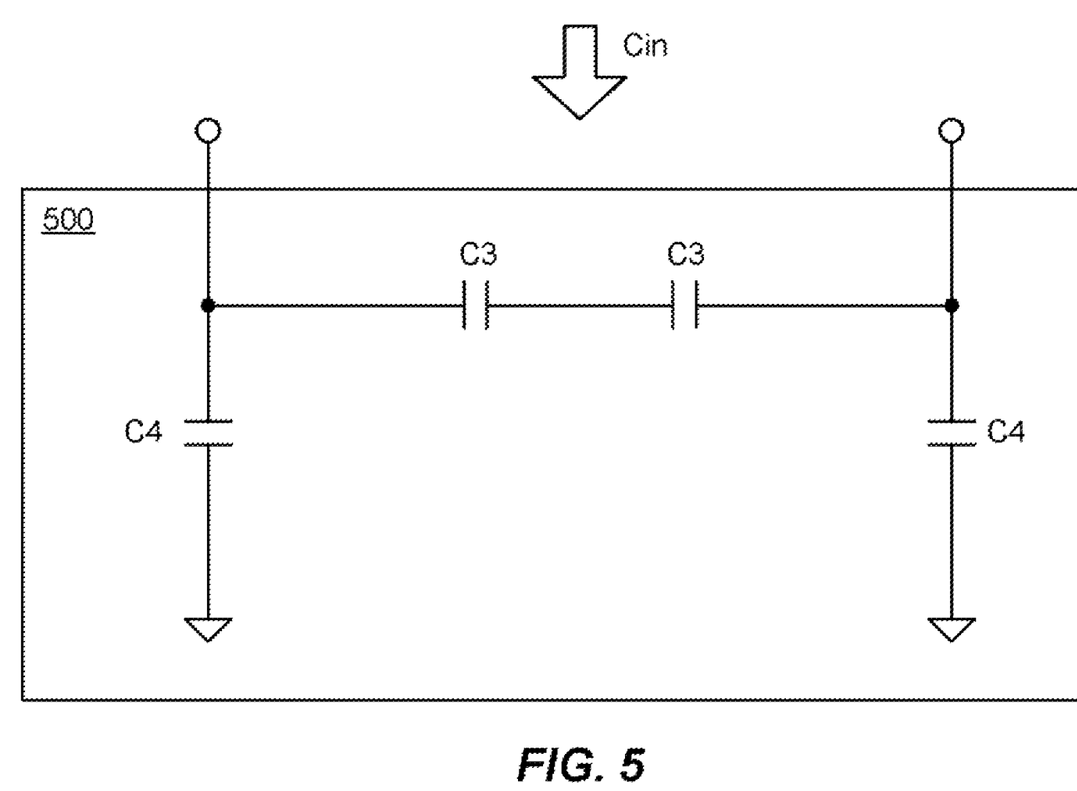
FIG. 5 shows a general representation of a 2-port capacitance network at a differential node.
Figure 6:
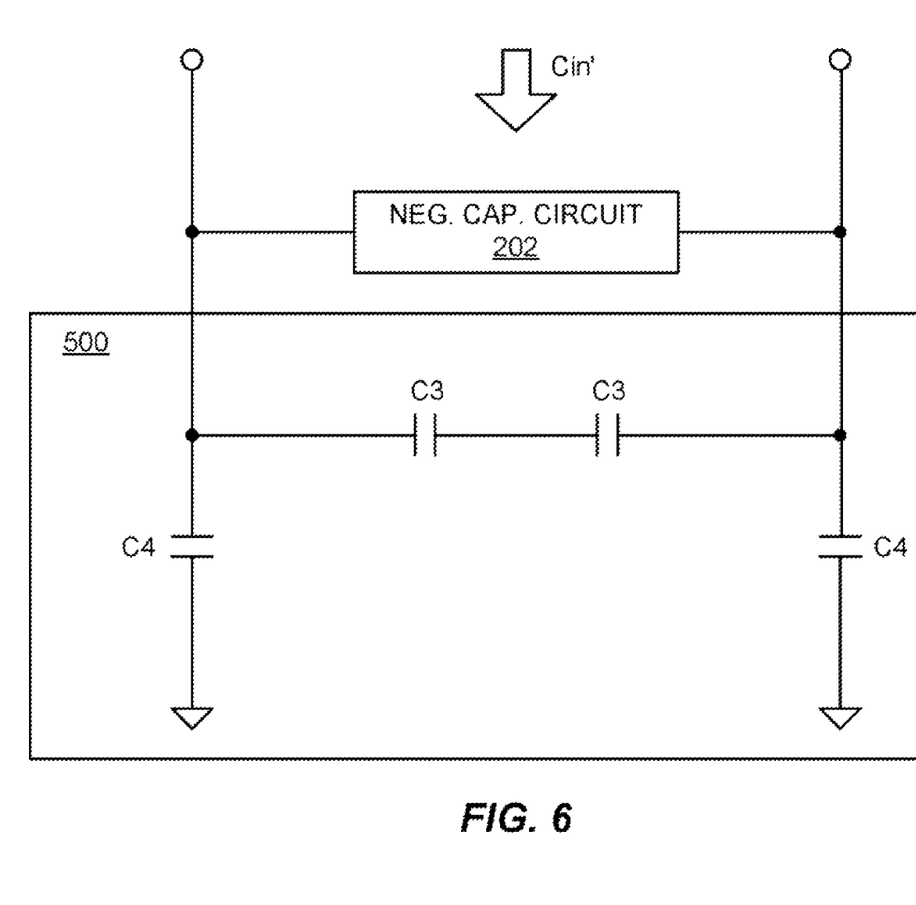
FIG. 6 shows a negative capacitance circuit of an embodiment of the present invention added in parallel with the capacitance network of FIG. 5.

FIGS. 2 and 4 were used to show how the negative capacitance circuit 202 can be used to reduce (and preferably cancel) the differential capacitance of the differential equalizer stage 100 introduced in FIG. 1, while boosting the common mode capacitance. FIGS. 5 and 6 will now be used more generally illustrate a 2-port capacitor network of a differential circuit 500, and how the negative capacitance circuit 202 can be used to reduce (and preferably cancel) the differential capacitance of the differential circuit 500, while boosting the common mode capacitance.

Referring to FIG. 5, the input capacitance (Cin) of the differential circuit 500 has both a differential mode capacitance (Cdiff) and a common mode capacitance Ccm. The differential mode capacitance Cdiff=(½)*(C3+C4). The common mode capacitance Ccm=2*C4.

Referring now to FIG. 6, the negative capacitance circuit 202 is shown as being connected in parallel with differential circuit of FIG. 5. The negative capacitance circuit 202 will synthesize a differential mode capacitance=−((C1*C2)/(C1+C2)), and a common mode capacitance=C1+C2. Thus, in FIG. 6, when putting the negative capacitance circuit 202 in parallel with the differential circuit 500, the net differential mode capacitance (Cdiff') and the net common mode capacitance (Ccm') are as follows:

$$Cdiff'=(½)*(C3+C4))-((C1*C2)/(C1+C2)), \text{ and}$$

$$Ccm'=(2*C4)+C1+C2$$

This enables the canceling of the differential mode capacitance, while boosting the common mode capacitance. In this manner, high frequency common mode gain will be constrained, while boosting high frequency differential mode gain.

In accordance with an embodiment, C1=C2. In such an embodiment, the negative capacitance circuit 202 will synthesize a differential mode capacitance and a common mode capacitance as follows: Cdiff=−(½)*(C1); and Ccm=2*C1. Referring again to FIG. 6, presuming C1=C2, when putting the negative capacitance circuit 202 in parallel with the differential input/differential output circuit 500, the differential mode capacitance Cdiff'=(½)*(C3+C4))−((½)*(C1)), and the common mode capacitance Ccm'=(2*C4)+(2*C1). Again, this enables the canceling of the differential mode capacitance, while boosting the common mode capacitance.

Embodiments of the present invention are also directed to methods for use with a circuit having differential nodes, such as differential input terminals, differential outputs terminals, and differential internal nodes. In an embodiment, such a method includes generating a negative capacitance circuit between differential nodes to thereby reduce a differential capacitance at the differential nodes while boosting the common mode capacitance at the differential nodes. As was described above, this can be accomplished by connecting a negative capacitance circuit between the differential nodes. The differential nodes, where the negative capacitance circuit may be connected, are any high impedance differential nodes that can affect the frequency response of the circuit. For example, in the embodiments described above with reference to FIGS. 2 and 4, the negative capacitance circuit is connected between the high impedance differential outputs of the differential stage 100. However, if input terminals (or internal nodes) of a differential circuit have a high impedance, the negative capacitance circuit (e.g., 202) can be connected between such other differential nodes (e.g., between differential inputs of a differential circuit).

The foregoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A negative capacitance circuit, comprising:
   a first transistor (Q1) having a control terminal (base or gate) and a current path including a first current path terminal (collector or drain) and a second current path terminal (emitter or source), the first current path terminal (collector or drain) of the first transistor (Q1) connected to a first voltage rail;
   a second transistor (Q2) having a control terminal (base or gate) and a current path including a first current path terminal (collector or drain) and a second current path terminal (emitter or source), the first current path terminal (collector or drain) of the second transistor (Q2) connected to the first voltage rail;
   a third transistor (Q3) having a control terminal (base or gate) and a current path including a first current path terminal (collector or drain) and a second current path terminal (emitter or source), the control terminal (base or gate) of the third transistor (Q3) connected to the second current path terminal (emitter or source) of the first transistor (Q1), and the first current path terminal (collector or drain) of the third transistor (Q3) connected to the control terminal (base or gate) of the second transistor (Q2);
   a fourth transistor (Q4) having a control terminal (base or gate) and a current path including a first current path terminal (collector or drain) and a second current path terminal (emitter or source), the control terminal (base or gate) of the fourth transistor (Q4) connected to the second current path terminal (emitter or source) of the second transistor (Q2), and the first current path terminal (collector or drain) of the fourth transistor (Q4) connected to the control terminal (base or gate) of the first transistor (Q1);
a first bias current source (Ibias) connected between the second current path terminal (emitter or source) of the first transistor (Q1) and a second voltage rail;
a second bias current source (Ibias) connected between the second current path terminal (emitter or source) of the second transistor (Q2) and the second voltage rail;
a third bias current source (Ibias) connected between the second current path terminal (emitter or source) of the third transistor (Q3) and the second voltage rail;
a fourth bias current source (Ibias) connected between the second current path terminal (emitter or source) of the fourth transistor (Q4) and the second voltage rail;
a first capacitor (C1) connected between the second current path terminal (emitter or source) of the fourth transistor (Q4) and the second voltage rail; and
a second capacitor (C2) connected between the second current path terminal (emitter or source) of the third transistor (Q3) and the second voltage rail.

2. The negative capacitance circuit of claim 1, further comprising:
a first diode (Q5) connected between the second current path terminal (emitter or source) of the first transistor (Q1) and the first bias current source (Ibias); and
a second diode (Q6) connected between the second current path terminal (emitter or source) of the second transistor (Q2) and the second bias current source (Ibias).

3. The negative capacitance circuit of claim 1, wherein the control terminals (bases or gates) of the first and second transistors (Q1) and (Q2) form the input terminals of the negative capacitance circuit.

4. The negative capacitance circuit of claim 1, further comprising:
a first resistor (R1) including a first resistor terminal and second resistor terminal, the first resistor terminal of the first resistor (R1) connected to the control terminal (base or gate) of the first transistor (Q1) and to the first current path terminal (collector or drain) of the fourth transistor (Q4); and
a second resistor (R2) including a first resistor terminal and second resistor terminal, the first resistor terminal of the second resistor (R2) connected to the control terminal (base or gate) of the second transistor (Q2) and to the first current path terminal (collector or drain) of the third transistor (Q3);
wherein the second resistor terminal of the first resistor (R1) and the second resistor terminal of the second resistor (R2) form the input terminals of the negative capacitance circuit.

5. The negative capacitance circuit of claim 4, wherein the first resistor (R1) and the second resistor (R2) each comprise a diode connected transistor, a discrete resistor, or a metal-oxide-semiconductor (MOS) resistor.

6. The negative capacitance circuit of claim 1, wherein:
the first voltage rail is a positive voltage rail; and
the second voltage rail is a negative voltage rail or ground.

7. The negative capacitance circuit of claim 1, wherein:
the first voltage rail is a negative voltage rail or ground; and
the second voltage rail is a positive voltage rail.

8. The negative capacitance circuit of claim 1, wherein the first, second, third and fourth transistors (Q1, Q2, Q3 and Q4) are NPN bi-polar junction transistors (BJTs).

9. The negative capacitance circuit of claim 1, wherein the first, second, third and fourth transistors (Q1, Q2, Q3 and Q4) are PNP bi-polar junction transistors (BJTs).

10. The negative capacitance circuit of claim 1, wherein the first, second, third and fourth transistors (Q1, Q2, Q3 and Q4) are NMOS transistors.

11. The negative capacitance circuit of claim 1, wherein the first, second, third and fourth transistors (Q1, Q2, Q3 and Q4) are PMOS transistors.

12. A negative capacitance circuit, comprising:
a first circuit branch connected between a first voltage rail and a second voltage rail, the first circuit branch including a first transistor (Q1) having a current path in series with a first bias current source (Ibias);
a second circuit branch connected between the first voltage rail and the second voltage rail, the second circuit branch including a second transistor (Q2) having a current path in series with a second bias current source (Ibias);
a third circuit branch connected between a control terminal (base or gate) of the second transistor (Q2) and the second voltage rail, the third circuit branch including a third transistor (Q3) having a current path in series with a third bias current source (Ibias);
a fourth circuit branch connected between a control terminal (base or gate) of the first transistor (Q1) and the second voltage rail, the fourth circuit branch including a fourth transistor (Q4) having a current path in series with a fourth bias current source (Ibias);
a first capacitor (C1) connected between the second voltage rail and a node of the fourth circuit branch that is between the current path of the fourth transistor (Q4) and the fourth bias current source (Ibias);
a second capacitor (C2) connected between the second voltage rail and a node of the third circuit branch that is between the current path of the third transistor (Q3) and the third bias current source (Ibias); and
wherein a control terminal of the third transistor (Q3) is connected to a node of the first circuit branch that is between the current path of the first transistor (Q1) and the first bias current source (Ibias); and
wherein a control terminal of the fourth transistor (Q4) is connected to a node of the second circuit branch that is between the current path of the second transistor (Q2) and the second bias current source (Ibias).

13. The negative capacitance circuit of claim 12, wherein the control terminals (bases or gates) of the first and second transistors (Q1) and (Q2) form the input terminals of the negative capacitance circuit.

14. The negative capacitance circuit of claim 12, further comprising:
a first resistor (R1) including a first resistor terminal and second resistor terminal, the first resistor terminal of the first resistor (R1) connected to the control terminal (base or gate) of the first transistor (Q1); and
a second resistor (R2) including a first resistor terminal and second resistor terminal, the first resistor terminal of the second resistor (R2) connected to the control terminal (base or gate) of the second transistor (Q2);
wherein the second resistor terminal of the first resistor (R1) and the second resistor terminal of the second resistor (R2) form the input terminals of the negative capacitance circuit.

15. The negative capacitance circuit of claim 14, wherein the first resistor (R1) and the second resistor (R2) each comprise a diode connected transistor, a discrete resistor, or a metal-oxide-semiconductor (MOS) resistor.

16. The negative capacitance circuit of claim 12, further comprising:
  a first diode (Q5) connected between the current path of the first transistor (Q1) and the node of the first circuit branch that is connected to the control terminal of the third transistor (Q3); and
  a second diode (Q6) connected between the current path of the second transistor (Q1) and the node of the second circuit branch that is connected to the control terminal of the fourth transistor (Q4).

17. The negative capacitance circuit of claim 16, wherein the first diode (Q5) and the second diode (Q6) each comprise a diode connected transistor.

18. The negative capacitance circuit of claim 12, wherein the first, second, third and fourth transistors are bi-polar junction transistors (BJTs).

19. The negative capacitance circuit of claim 1, wherein the first, second, third and fourth transistors (Q1, Q2, Q3 and Q4) are metal-oxide-semiconductor field effect transistors (MOSFETs).

* * * * *